(12) United States Patent
Koob et al.

(10) Patent No.: US 9,785,211 B2
(45) Date of Patent: Oct. 10, 2017

(54) INDEPENDENT POWER COLLAPSE METHODOLOGY

(71) Applicant: QUALCOMM Incorporated, San Diego, CA (US)

(72) Inventors: Christopher Edward Koob, Round Rock, TX (US); Xufeng Chen, San Diego, CA (US); Robert Allan Lester, Round Rock, TX (US); Manojkumar Pyla, San Diego, CA (US); Peixin Zhong, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 119 days.

(21) Appl. No.: 14/622,467

(22) Filed: Feb. 13, 2015

(65) Prior Publication Data

US 2016/0239060 A1 Aug. 18, 2016

(51) Int. Cl.
*G06F 1/26* (2006.01)
*G06F 1/32* (2006.01)
*H03K 19/00* (2006.01)

(52) U.S. Cl.
CPC ............ *G06F 1/26* (2013.01); *G06F 1/3237* (2013.01); *G06F 1/3287* (2013.01); *H03K 19/0016* (2013.01); *Y02B 60/1221* (2013.01); *Y02B 60/1282* (2013.01)

(58) Field of Classification Search
CPC ....................................................... G06F 1/26
See application file for complete search history.

(56) References Cited

U.S. PATENT DOCUMENTS

| 6,115,760 A * | 9/2000 | Lo ........................ G06F 5/08 710/52 |
| 6,590,819 B1* | 7/2003 | Baum .................... G11C 7/06 365/202 |
| 7,080,341 B2 | 7/2006 | Eisenstadt et al. |
| 7,369,815 B2 | 5/2008 | Kang et al. |

(Continued)

FOREIGN PATENT DOCUMENTS

| EP | 2482456 A2 | 8/2012 |
| JP | 2012-003530 A | 1/2012 |

OTHER PUBLICATIONS

International Search Report and Written Opinion, PCT/US2016/012363, dated Jul. 4, 2016, 30 pages.

(Continued)

*Primary Examiner* — Thomas Lee
*Assistant Examiner* — Chad Erdman
(74) *Attorney, Agent, or Firm* — W&T/Qualcomm

(57) ABSTRACT

The feature size of semiconductor devices continues to decrease in each new generation. Smaller channel lengths lead to increased leakage currents. To reduce leakage current, some power domains within a device may be powered off (e.g., power collapsed) during periods of inactivity. However, when power is returned to the collapsed domains, circuitry in other power domains may experience significant processing overhead associated with reconfiguring communication channels to the newly powered domains. Provided in the present disclosure are exemplary techniques for isolating power domains to promote flexible power collapse while better managing the processing overhead associated with reestablishing data connections.

30 Claims, 7 Drawing Sheets

(56) References Cited

U.S. PATENT DOCUMENTS

| | | | |
|---|---|---|---|
| 7,982,498 B1 * | 7/2011 | Chen | H03K 3/35613 326/21 |
| 7,996,811 B2 | 8/2011 | Hoberman et al. | |
| 8,020,017 B2 | 9/2011 | Padhye et al. | |
| 8,339,177 B2 | 12/2012 | Jarrar et al. | |
| 8,726,047 B2 | 5/2014 | Lee et al. | |
| 9,190,989 B1 * | 11/2015 | Sharda | G06F 1/3293 |
| 2006/0125470 A1 * | 6/2006 | Chen | G01R 31/3012 324/750.3 |
| 2007/0268764 A1 * | 11/2007 | Kim | G11C 7/065 365/205 |
| 2010/0019774 A1 | 1/2010 | Wu et al. | |
| 2010/0042858 A1 * | 2/2010 | Padhye | G06F 1/3287 713/323 |
| 2010/0174933 A1 * | 7/2010 | Lu | G06F 1/3237 713/324 |
| 2011/0161691 A1 * | 6/2011 | Tatsumi | G06F 1/26 713/300 |
| 2012/0025905 A1 | 2/2012 | Hoshi et al. | |
| 2012/0068539 A1 | 3/2012 | Shiotani | |
| 2012/0187998 A1 | 7/2012 | Jarrar et al. | |
| 2012/0275236 A1 * | 11/2012 | Hess | G06F 1/3203 365/189.02 |
| 2013/0047000 A1 * | 2/2013 | Alarcon | H03K 3/0315 713/300 |
| 2013/0140905 A1 | 6/2013 | Huang et al. | |
| 2015/0026494 A1 * | 1/2015 | Bainbridge | G06F 1/324 713/322 |
| 2016/0071574 A1 * | 3/2016 | Hess | G11C 11/419 365/156 |

OTHER PUBLICATIONS

Invitation to Pay Additional Fees and Partial Search Report, PCT/US2016/012363, dated Apr. 25, 2016, 11 pages.
Second Written Opinion for PCT/US2016/012363, mailed Feb. 20, 2017, 6 pages.
Third Written Opinion for PCT/US2016/012363, dated May 11, 2017, 5 pages.
International Preliminary Report on Patentability for PCT/US2016/012363, dated Jul. 5, 2017, 54 pages.

* cited by examiner

INDEPENDENT POWER COLLAPSE METHODOLOGY

BACKGROUND

1. Field of the Disclosure

The present application generally relates to power efficient semiconductor design and, more specifically, to systems and methods for isolating power domains within integrated circuits.

2. Description of Related Art

In many electrical devices, and especially mobile devices, power consumption of the associated integrated circuits is a major design consideration. This power consumption primarily comprises switching current that results from actively functioning circuitry and leakage current that results from inactive circuitry passively drawing power.

As integrated circuit fabrication technology continually improves and migrates to smaller geometry, the size of transistors (e.g., their minimum channel length) continues to shrink. Additionally, the threshold voltage for smaller-size transistors, which is the voltage at which a transistor turns on, is often reduced to improve operating speed. The lower threshold voltages permit reductions in the power supply voltage, which in turn may reduce power consumption. But, the lower threshold voltages and smaller-size transistors can also lead to higher leakage currents, where "leakage" currents are, e.g., currents passing through transistors that are in an "off" state. Such leakage currents generally become more problematic as integrated circuit transistors continue to scale down in size. One technique to decrease leakage current is powering off certain portions of the integrated circuit when these portions are not in use. This technique is sometimes referred to as "power collapse."

To implement power collapse, an integrated circuit is generally organized into a plurality of power domains, where each power domain may contain one or more processing nodes, peripherals, and/or other circuitry. Power domains may have varying voltage levels from each other, and different power domains may also have asynchronous clocks. In general, each power domain is individually controllable, such that one power domain may be power collapsed during a time when other power domains remain active.

During operation, circuitry within one power domain may need to communicate with circuitry in another power domain. Often, the different power domains also correspond to different clock domains, leading to clocking concerns at the boundaries between the domains. Accordingly, systems may need a cross-domain interconnect and protocols for data to flow between different power domains. Current protocols, such as the Advanced Extensible Interface (AXI) set forth by the Advanced Microcontroller Bus Architecture (AMBA), provide signaling and certain other aspects of an interconnect.

SUMMARY

The disclosed principles provide for efficiently and methodically isolating and de-isolating a plurality of power domains from one another in a modular manner, thereby allowing processing nodes or logic within each power domain to operate autonomously when so desired.

For example, described in accordance with some aspects of the disclosure is a semiconductor device having a first processing node in a first power domain and a second processing node in a second power domain. The semiconductor device may comprise an isolation module which may comprise a buffer located between the first and second power domains. The buffer may be operable to selectively provide an electrical connection between the first and second power domains. The isolation module may further comprise a first logical isolation unit between the buffer and the first processing node as well as a second logical isolation unit between the buffer and the second processing node. The semiconductor device may further comprise an isolation sequencer operable to control the isolation module when an isolation sequence and a de-isolation sequence are performed. After the isolation sequence is performed, the first and second logical isolation units may be operable to logically isolate the buffer from the first and second processing nodes, respectively, and the buffer may be operable to provide electrical isolation between the first and second power domains. Further, after the de-isolation sequence is performed, the buffer may be operable to provide communication from the first processing node to the second processing node.

Also disclosed in accordance with some aspects of the disclosed principles is a semiconductor device having a first processing node in a first power domain and a second processing node in a second power domain, the semiconductor device comprising an isolation module operable to selectively enable communication from the first processing node to the second processing node. The isolation module may comprise means for selectively providing an electrical connection between the first and second power domains. The isolation module may further comprise means for logically isolating the means for selectively providing the electrical connection from both the first processing node and the second processing node. The semiconductor device may further comprise means for controlling the isolation module when an isolation sequence and a de-isolation sequence are performed. After the isolation sequence is performed, the means for selectively providing the electrical connection may be logically isolated from the first and second processing nodes, and electrical isolation may be provided between the first and second power domains. Further, after the de-isolation sequence is performed, the isolation module may permit communication from the first processing node to the second processing node.

Also disclosed is a non-transitory machine-readable medium having instructions stored thereon. The instructions may be executable by one or more processors for providing, by a buffer between first and second power domains, an electrical connection between the first and second power domains. The instructions may further be executable for disabling clocks associated with the first and second power domains. The instructions may further be executable for isolating, by a first logical isolation unit, the buffer from a first processing node, and isolating, by a second logical isolation unit, the buffer from a second processing node. Additionally, the instructions may further be executable for enabling, within the buffer, electrical isolation between the first and second power domains, and re-enabling the clocks associated with at least one of the first and second power domains.

Also disclosed is a method for providing isolation between a first processing node in a first power domain and a second processing node in a second power domain. The method may comprise selectively providing, by a buffer between the first and second power domains, an electrical connection between the first and second power domains. The method may further comprise disabling clocks associated with the first and second power domains. The method may further comprise isolating, by a first logical isolation unit, the buffer from the first processing node, and isolating, by a second logical isolation unit, the buffer from the second processing node. Additionally, the method may comprise enabling, within the buffer, electrical isolation between the first and second power domains, and re-enabling the clocks associated with at least one of the first and second power domains.

The disclosed principles provide a variety of benefits, especially relating to power efficiency, reliability, and modular system design. For example, according to some aspects of the disclosure, the decisions to undergo isolation and de-isolation between power domains may be decoupled from the power collapse decisions. This decoupling may simplify the design process and promote design reuse while also providing increased flexibility in power control. In further accordance with the disclosed principles, isolation may occur transparently to the processing nodes, such that a processing node in a power domain maintaining power after the isolation sequence may not need to re-configure its connection to the other processing node after isolation is removed from the connection, thereby reducing the processing overhead associated with power domain isolation and power collapse.

BRIEF DESCRIPTION OF DRAWINGS

Features and aspects of the disclosure are described in conjunction with the attached drawings, in which.

Figure 1:
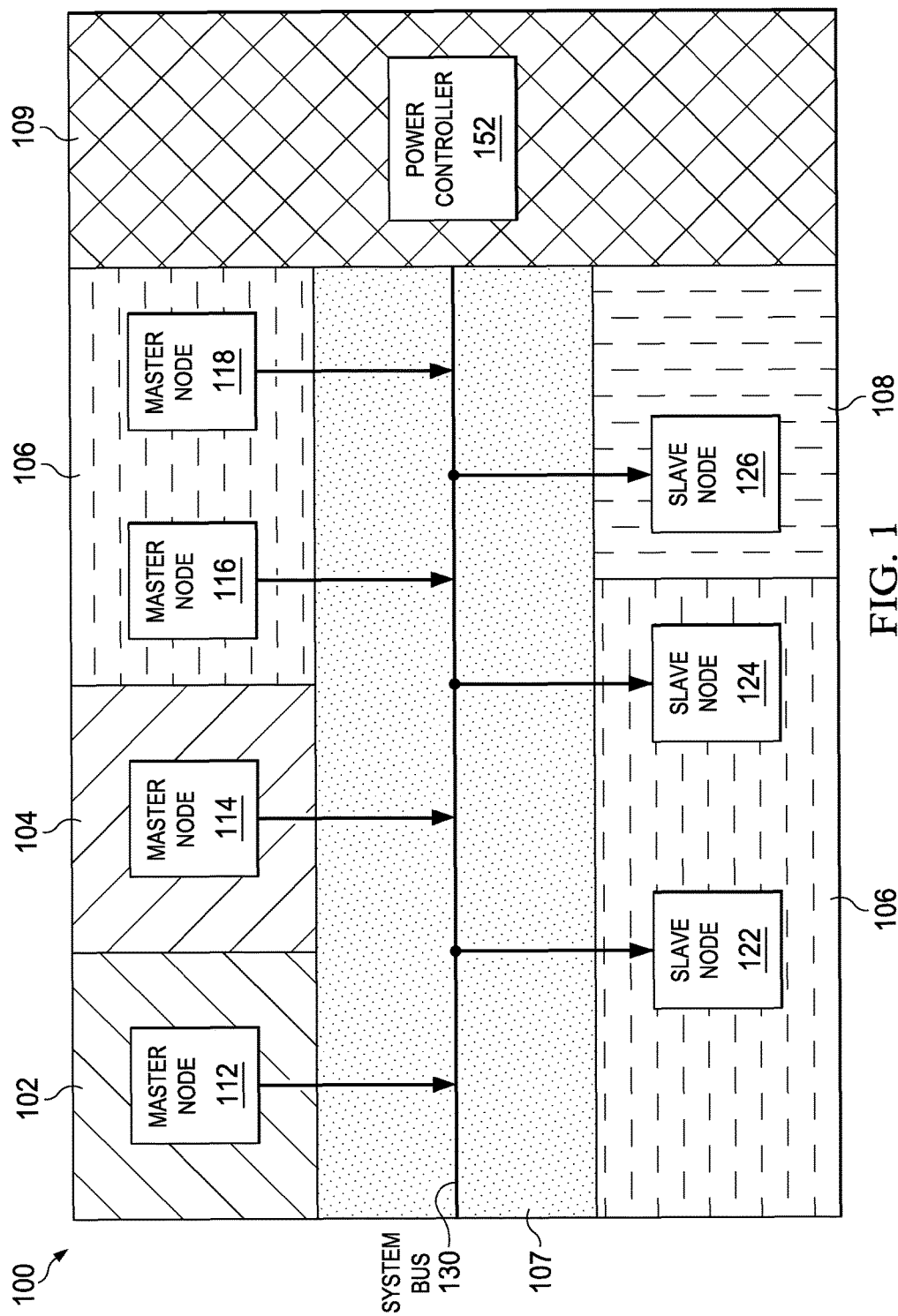
FIG. 1 shows a block diagram of a system having a plurality of power domains that may be implemented within an integrated circuit.

These exemplary figures are to provide a written, detailed description of the subject matter set forth by any claims that issue from the present application. These exemplary figures should not be used to limit the scope of any such claims.

Further, although similar reference numbers may be used to refer to similar structures for convenience, each of the various sets of features and aspects may be considered to be distinct variations. When similar reference numerals are used, a description of the common elements may not be repeated, as the functionality of these elements may be the same or similar. In addition, the figures are not to scale unless explicitly indicated otherwise.

DETAILED DESCRIPTION

FIG. 1 shows a block diagram of a system 100 having a plurality of power domains that may be implemented within an integrated circuit. The system comprises a plurality of master nodes 112, 114, 116, 118 and a plurality of slave nodes 122, 124, 126. The master nodes may communicate with the slave nodes and with each other via a system bus 130. A master node may generally initiate commands and requests on the system bus 130, whereas a slave node may generally receive commands and requests on the system bus 130. For example, the primary processing core or cores of a device (e.g., a digital signal processing core) may serve as master nodes, whereas memory devices and peripheral units (e.g., providing USB or Bluetooth connectivity) may serve as slave nodes. The choices of master nodes and slave nodes depend on the desired topology of the end system.

The master nodes 112, 114, 116, 118, the slave nodes 122, 124, 126, and the system bus 130 may be implemented in a plurality of power domains. Specifically, and as shown in FIG. 1, the master node 112 is in a power domain 102, the master node 114 is in a power domain 104, the master nodes 116 and 118 and the slave nodes 122 and 124 are in a power domain 106, and the slave node 126 is in a power domain 108. Each power domain 102, 104, 106, 108 may be connected to a clock source and to a power rail or supply. Some power domains may share a power rail or supply and/or a clock with other power domains. However, even when power domains share a power rail, they may be separately connected such that the power domains may be individually power collapsed and powered on.

The system 100 may also comprise a power controller 152 in an always-on power domain 109. The power controller 152 may power collapse and power on any of the collapsible power domains 102, 104, 106, 107, 108. In order to maintain control over other power domains, the always-on power domain may remain powered on whenever the system 100 receives power.

As shown in FIG. 1, the system bus 130 may be in a separate power domain 107 from the nodes. Accordingly, the system bus 130 may be independently powered on and powered collapsed. In accordance with some aspects of the present disclosure, the system bus 130 or portions of the system bus 130 may share a power domain with one or more nodes (e.g., in the power domain 106). Alternatively, the system bus 130 or portions of the system bus 130 may be in the always-on power domain 109 or otherwise independent from the nodes and power domains that the system bus 130 services.

Nodes may perform certain tasks that require more than one power domain to be powered on for completion. For example, if the master node 112 needs to communicate with the slave node 126, the power domains 102, 107, and 108 may require power. Accordingly, the expected activities of the nodes may determine which power domains need to remain powered on.

Before a power domain is powered collapsed, the communication channels leading into and out of that power domain may be severed, such that logic in the soon-to-be-collapsed power domain is isolated from logic in the power domains that will remain active. In conventional systems, custom "wrapper" logic is included at every interface between power domains to provide the necessary isolation. This wrapper logic may manage clock skews when the voltages of adjacent power domains are different, and the wrapper logic may also handle asynchronous clocks and level shifting. The wrapper logic is often closely integrated with the power collapse process such that it is triggered exclusively during power collapse.

In the design of integrated circuits, most subsystems and functional blocks of logic are created as modular intellectual property (IP) cores or IP blocks. This allows certain functionality to be reproduced within an integrated circuit to reduce total design costs and time. Further, IP blocks may be replicated to provide tested and proven functionality in new integrated circuit designs. Some IP blocks are hard IP blocks that describe exact mask sets to create the end circuits in and/or on a substrate. For example, a semiconductor design company may use a hard IP block of an Ethernet PHY for multiple application-specific integrated circuits (ASIC) using a common manufacturing process (e.g., 28 nm). Other IP blocks are soft IP blocks that describe certain circuits and functionality using a hardware description language such as Verilog. Soft IP blocks may be created in the form of a programmed list of connections (e.g., a net-list). Soft IP blocks have the benefit of being reusable across multiple processes. Both hard IP blocks and soft IP blocks have boundaries which also establish the interfaces by which the IP blocks can be connected to other IP blocks. The term "IP block" as used herein may refer to both soft IP blocks and hard IP blocks.

Figure 2:
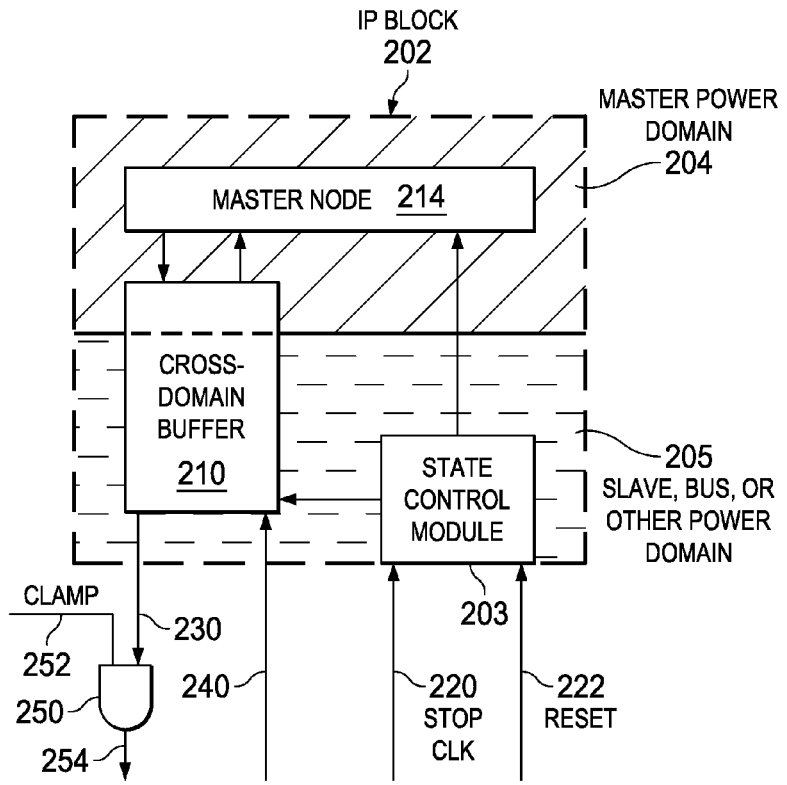
FIG. 2 shows a block diagram illustrating an IP block.

FIG. 2 shows a block diagram illustrating an IP block 202. The IP block 202 includes a master node 214 that resides in a first power domain 204. The IP block 202 further includes wrapper logic that extends into a second power domain 205. The wrapper logic may comprise a cross-domain buffer 210 which bridges the first power domain 204 (e.g., master power domain) and the second power domain 205 (e.g., slave, bus, or other power domain) as well as a state control module 203 for managing control signals to the cross-domain buffer 210 and the master node 214. As a result of the cross-domain buffer 210 being included in the IP block 202, the master power domain 204 may be "hidden" from other nodes desiring to communicate with the master node 214.

The boundary of the IP block 202 defines an interface by which other nodes and circuitry communicate with the circuitry inside the IP block 202. The IP block 202 may receive a stop clock signal 220 and a reset signal 222 via the state control module 203 located at or near this interface. As the cross-domain buffer 210 is within the IP block 202, it would be affected by these same signals 220 and 222. Accordingly, the cross-domain buffer 210 is jointly reset with the master node 214.

For the purposes of the following explanation, the cross-domain buffer 210 is a unidirectional buffer that outputs signals from the master node 214 via a buffer data output signal 230 and receives acknowledgement signals via a buffer acknowledgement input signal 240. In accordance with some aspects of the disclosure, a plurality of buffers may be used, and data may flow bidirectionally between the master node 214 and nodes within or connected by the second power domain 205.

A clamp 250 may be applied to the output signal 230 of the cross-domain buffer 210. The clamp 250 may be an AND gate receiving a clamp signal 252 and the buffer data output signal 230 as inputs. When the clamp signal 252 is de-asserted (e.g., pulled high), the clamp 250 may allow the buffer data output signal 230 to pass as a clamp output signal 254. When the clamp signal 252 is asserted (e.g., pulled low), the clamp 250 may become activated and may hold the clamp output signal 254 at a fixed voltage (e.g., low), independent of the buffer data output signal 230. As such, the clamp 250 may block outgoing signals from the master node 214, when active.

When a power controller decides to power collapse the first power domain 204, the power controller may verify that the master node 214 is idle. Further, the clamp 250 may be activated to hold the clamp output signal 254 fixed. This may prevent any spurious outputs from the master node 214 during and after the collapse of the first power domain 204. Additionally, one or more clock(s) associated with the first power domain 204 may be stopped via the stop clock signal 220. Finally, the first power domain 204 may be power collapsed, e.g., by disconnecting it from a power supply.

When the power controller decides to power on the first power domain 204, a different sequence may be used. The clock(s), if active, may be stopped via the stop clock signal 220. This may be necessary in scenarios where the master node 214 shares a clock with other nodes that remain powered on. After the clock(s) are disabled, power may be applied to the first power domain 204 and the master node 214. Then, electrical isolation of data lines between the first power domain 204 and the second power domain 205 may be removed. This electrical isolation may, for example, be integrated within the cross-domain buffer 210 and is not shown. At this point, the master node 214 and its associated buffer 210 may be jointly reset via a reset signal 222. Next, the clamp 250 may be deactivated such that the buffer data output signal 230 may pass through the clamp 250 as the clamp output signal 254. Finally, the clock(s) to the first power domain 204 may be re-enabled via de-assertion of the stop clock signal 220.

As shown in FIG. 2, the cross-domain buffer 210 is integrated with the master node 214 by being part of the same IP block 202. While this may be a sufficient and convenient solution during the design stage, it reduces the flexibility of independently power collapsing the first power domain 204 and increases the complexity of the restarting sequence as well as the logic required at the power controller. This is because the power collapse logic recognizes boundary-specific conditions and factors (e.g., the clamp 250).

In accordance with the disclosed principles and described further below, systematic and reproducible isolation modules may be inserted at or near the boundaries between the nodes of different power domains. Further, the isolation modules may receive control signals from an isolation sequencer to enable and disable isolation, where the isolation control signals may be decoupled from power control signals (e.g., for power collapsing a power domain). By providing modular isolation, a system power manager (e.g., a power controller) may implement control without necessarily needing to know the specific details of how isolation is performed between any given set of power domains. This contrasts with the wrapper approach, where the system power manager must recognize and handle implementation details of isolation at each power domain boundary.

Figure 3:
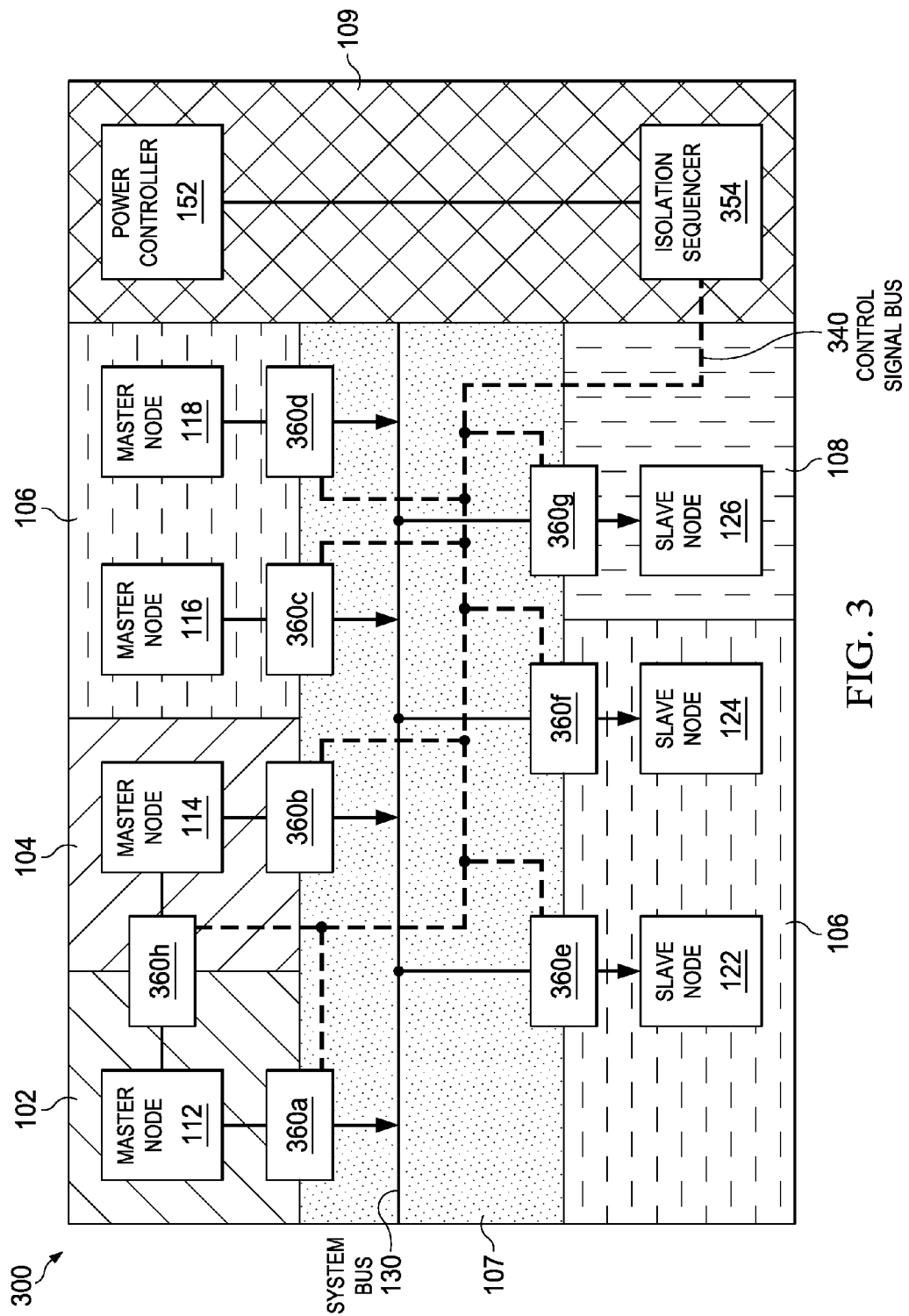
FIG. 3 shows a block diagram illustrating a system for managing power collapse.

FIG. 3 shows a block diagram illustrating a system 300 for managing power collapse. Like the system of FIG. 1, the system 300 may be implemented in an integrated circuit (e.g., a semiconductor device).

The system 300 includes isolation modules 360a through 360h (also referred to more generally as isolation modules 360) to manage the boundaries between different power domains. These isolation modules 360 may be designed as separate IP blocks from those having the master nodes 112, 114, 116, 118, or slave nodes 122, 124, 126. The master nodes 112, 114, 116, 118 and the slave nodes 122, 124, 126 may be individually connected to the system bus 130 in the power domain 107 through the isolation modules 360a, 360b, 360c, 360d, 360e, 360f, and 360g, respectively. Isolation modules 360 may also be used to connect nodes directly to another without using the system bus 130. For example, the isolation module 360h may be disposed between the power domain 102 and the power domain 104, where it may directly connect the master node 112 to the master node 114. The isolation modules 360 may serve as ports through which data and/or control signals may cross power domains. Each isolation module 360 may provide for one or more signals to pass between two power domains, and the isolation modules 360 may pass signals either unidirectionally or bidirectionally. Additionally, a plurality of isolation modules 360 may be implemented at one or more individual boundaries between power domains.

As shown in FIG. 3, if the master node 112 intends to communicate with the slave node 126, data may be sent via the system bus 130, and the data may pass through the isolation modules 360a and 360g. For this communication to take place, each of the power domains 102, 107, and 108 may be powered on, but the power domains 104 and 106 may be powered off with the isolation modules 360b, 360c, 360d, 360e, 360f, and 360h being active.

The isolation modules 360 may be controlled via a control signal bus 340 by an isolation sequencer 354 that may reside in an always-on power domain 109 with a power controller 152. The isolation sequencer 354 provides logic for activating and deactivating the isolation modules 360 in the system 300. Further, the isolation sequencer 354 may store state information of each of the isolation modules 360, and information mapping each isolation module 360 to the power domains it affects. As such, the isolation sequencer 354 simplifies the task of power collapse by the power controller 152, which can simply query the isolation sequencer 354 to determine which power domains have been properly isolated. If the power controller 152 determines from the isolation sequencer 354 that a power domain intended to be power collapsed is not properly isolated, the power controller 152 may issue a request to the isolation sequencer 354 to isolate that power domain.

For example, if the power controller 152 determines that the master node 114 does not need to remain active and decides to power collapse the power domain 104, the power controller 152 may query the isolation sequencer 354 to determine if the power domain 104 is properly isolated. The isolation sequencer 354 may recognize that the isolation modules 360b and 360h interface with the power domain 104. If the isolation sequencer 354 determines that the isolation modules 360b and 360h are activated and providing isolation, the isolation sequencer 354 may report back to the power controller 152 indicating that the power domain 104 is properly isolated. However, if the isolation sequencer 354 determines that either of the isolation module 360b, 360h are not isolated, the isolation sequencer 354 may alert the power controller 152. The power controller 152 may subsequently issue a request to the isolation sequencer 354 to activate the isolation modules 360b and/or 360h as necessary.

In accordance with some aspects of the disclosure, the power controller 152 simply requests that the isolation sequencer 354 prepare a power domain for being power collapsed. Upon receiving a request, the isolation sequencer 354 may determine the states of the relevant isolation modules 360 and issue commands over the control signal bus 340 to activate any relevant isolation modules 360 that are not already active. Upon determining that all relevant isolation modules 360 are active, the isolation sequencer 354 may send a signal to the power controller 152 indicating that the requested power domain is fully isolated. The power controller 152 may then proceed to power collapse the power domain.

In accordance with some aspects of the disclosure, the isolation sequencer 354 stores status information about the isolation modules 360 locally in the always-on power domain 109. This reduces or eliminates the necessity to poll the isolation modules 360 upon queries from the power controller 152. Instead, the isolation sequencer 354 may keep track of the last command sent to each isolation module 360. Alternatively, the isolation sequencer 354 may poll the individual isolation modules 360 over the control signal bus 340 based on the requests from the power controller 152. This provides the benefit of reducing the amount of memory required in the always-on power domain 109. The polling mechanism may be implemented in hardware or software. When the polling mechanism is implemented, at least in part, in software, the software may reside in a non-transitory machine-readable medium that is accessible by the isolation sequencer 354.

In accordance with some aspects of the disclosure, the isolation sequencer 354 may also perform an isolation sequence independently from requests and decisions made by the power controller 152. For example, if it is determined that the master node 112 will not need to communicate with other nodes for an extended period of time, the isolation sequencer may activate the isolation modules 360a and 360h, effectively severing the master node 112 from the other nodes and the system bus 130. The power controller 152 may, at a later time, make the decision to power collapse the power domain 102 of the master node 112. Alternatively, the master node 112 may continue to operate while each of the other collapsible power domains 104, 106, 107, and 108 are collapsed. In some scenarios, a node in a collapsible power domain may decide to be isolated or de-isolated and may send a request to the isolation sequencer 354 over the control signal bus 340.

The disclosed isolation system provides increased flexibility when making power collapse decisions. For example, prior implementations have not provided an effective solution for disabling a data bus while a connected processing core (e.g., in another power domain) is still active. In accordance with some aspects of the present disclosure, any power domain may be power collapsed irrespective of the states of the other power domains, as long as the proper isolation modules are active.

The following is an exemplary system that would benefit from such behavior. A sensor-processing core (e.g., a core dedicated to processing sensor input in real-time) may be coupled to external memory and other peripherals via a bus. The sensor-processing core may have sufficient internal cache to operate without requesting data over the bus for extended periods of time. Accordingly, only the sensor-processing core would need to be powered during these times. As indicated by the example of isolating the master node 112 above, the present disclosure provides for this scheme to be carried out efficiently.

While four master nodes and three slave nodes are shown in FIG. 3, certain system implementations may have more or fewer nodes of either type. Further, other topologies may be used that do not utilize a master-slave relationship. While FIG. 3 shows a single system bus 130, more than one bus may be selected to connect various nodes. Some nodes may interface with more than one bus. Further, some nodes may act as a master node on a first bus and as a slave node on a second bus.

While FIG. 3 shows unidirectional arrows between the nodes and the bus, it is to be understood that data may travel bidirectionally between any of the nodes and the bus. The directionality of the arrows merely indicates the direction in which control is generally applied (e.g., master nodes initiating communication with and/or requesting information from slave nodes).

Figure 4:
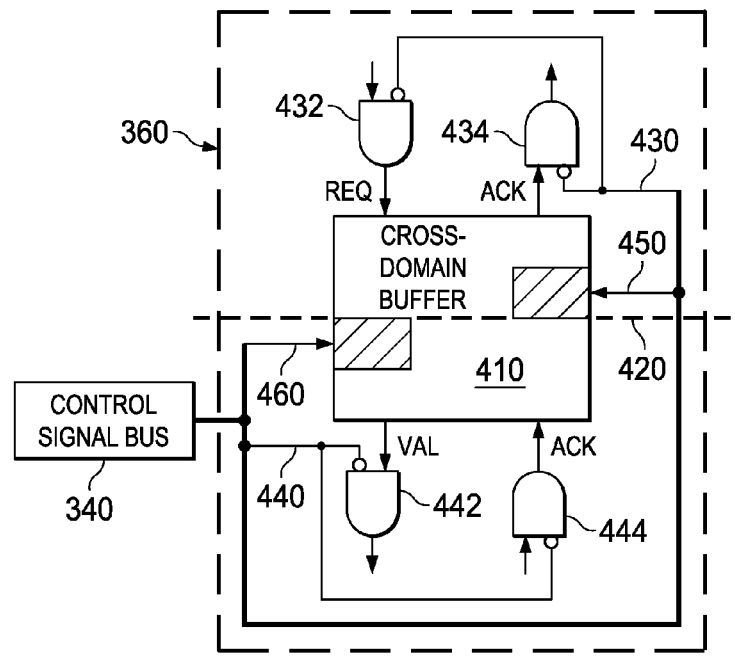
FIG. 4 shows a block diagram illustrating an isolation module in accordance with the present disclosure.

FIG. 4 shows a block diagram illustrating an isolation module 360 in accordance with the present disclosure. The isolation module 360 may comprise a cross-domain buffer 410 for passing data through a power domain boundary 420, which may also be a clock boundary 420. The cross-domain buffer 410 may, for example, be implemented as an asynchronous First-In-First-Out (FIFO) buffer 410. However, other types of buffers may be used, depending, at least in part, on the nature of the boundary 420. For example, when the power domains on either side of the boundary 420 share a common clock, the buffer 410 may not need to be asynchronous.

The buffer 410 may receive a request ("Req") signal from the input side when data is scheduled to be written to the buffer. After the data is written to the buffer, a request or valid data ("Val") signal may alert the output side that new data is available from the buffer 410. When the output side receives the valid data signal, it may read the new data from the buffer 410 and send a ready or acknowledgement ("Ack") signal that is passed through the buffer 410 back to the input side. This system provides both sides of the buffer with knowledge of the activity of the other side. Further, these signals may be used to prevent the buffer from overflowing. Not shown in FIG. 4 is the reset signal for resetting the buffer 410. Further, FIG. 4 does not show the data structure and data path for passing data and/or control signals across the boundary 420.

The isolation module 360 may include two distinct stages of isolation. The first stage may comprise logical isolation to isolate the buffer 410 from circuitry on either side of the boundary 420 (e.g., a master node and a bus). The second stage may comprise electrical isolation to provide isolation at the power domain boundary 420.

An isolation sequencer may trigger logical isolation by sending a "Logical Isolate In" signal 430 and a "Logical Isolate Out" signal 440 over the control signal bus 340. When the "Logical Isolate In" signal 430 is asserted (e.g., pulled high due to the inverters at the inputs), a logical isolation gate 432 may block request signals from being input to the buffer 410. Similarly, a logical isolation gate 434 may block acknowledgement signals from being sent to the input side. In effect, it would appear to circuitry on the input side that data was not being read from the buffer 410.

On the output side, the "Logical Isolate Out" signal 440 may be used to logically isolate the buffer 410 from the circuitry it may interface with (e.g., a slave node or system bus). When the "Logical Isolate Out" signal 440 is asserted (e.g., pulled high), a logical isolation gate 442 may prevent valid data signals from reaching circuitry on the output side. Additionally, a logical isolation gate 444 may prevent acknowledgement signals from reaching the buffer 410 and, ultimately, a node on the input side of the power domain boundary 420.

Accordingly, when the logical isolation gates 432, 434, 442, and 444 are active, the buffer 410 may be logically isolated from circuitry on both the input side and the output side. Further, the input side and the output side of the buffer 410 may be logically isolated from one another.

The buffer 410 may provide electrical isolation at the power domain boundary 420 upon request (e.g., from the isolation sequencer). As such, the buffer 410 may selectively provide an electrical connection between the power domains on either side of the boundary 420. For example, an "Electrical Isolate In" signal 450 from the control signal bus 340 may electrically disconnect or sever any connections (e.g., electrical connections) that lead into the input side from the output side. Similarly, an "Electrical Isolate Out" signal 460 from the control signal bus 340 may electrically disconnect or sever any connections that lead into the output side from the input side. When the electrical isolation signals 450 and 460 are asserted, the power domains on either side of the buffer 410 may power collapse independently from one another, where the electrical isolation may limit the effects of short circuit conditions at the boundary 420 (e.g., when a floating input to an active power domain is near the threshold voltage).

In accordance with some aspects of the disclosure, a sensor may be associated with the logical isolation gate 432 to generate an alert when the input side attempts to write to the buffer 410 during a time when the buffer 410 is isolated. This sensor may be used to detect uncommon events and programming mistakes without causing system failure, thereby contributing to a more robust design. For example, when the sensor issues an alert signal, a power controller may verify that the output side is powered on, and the isolation sequencer may de-isolate the buffer 410. This sequence may be transparent to circuitry on the input side, or alternatively, the input side circuitry may be alerted when the output side circuitry is reconnected. The input side may then attempt to re-send a request message, and the transaction (e.g., sending of data across the boundary 420) may be completed as intended.

While FIG. 4 shows a buffer having a valid data signal and an acknowledgement signal, numerous other handshaking techniques may be implemented to coordinate the transfer of data across the boundary 420. In other applications contemplated by the disclosure, more, fewer, or different handshaking signals may be implemented.

Figure 5A:
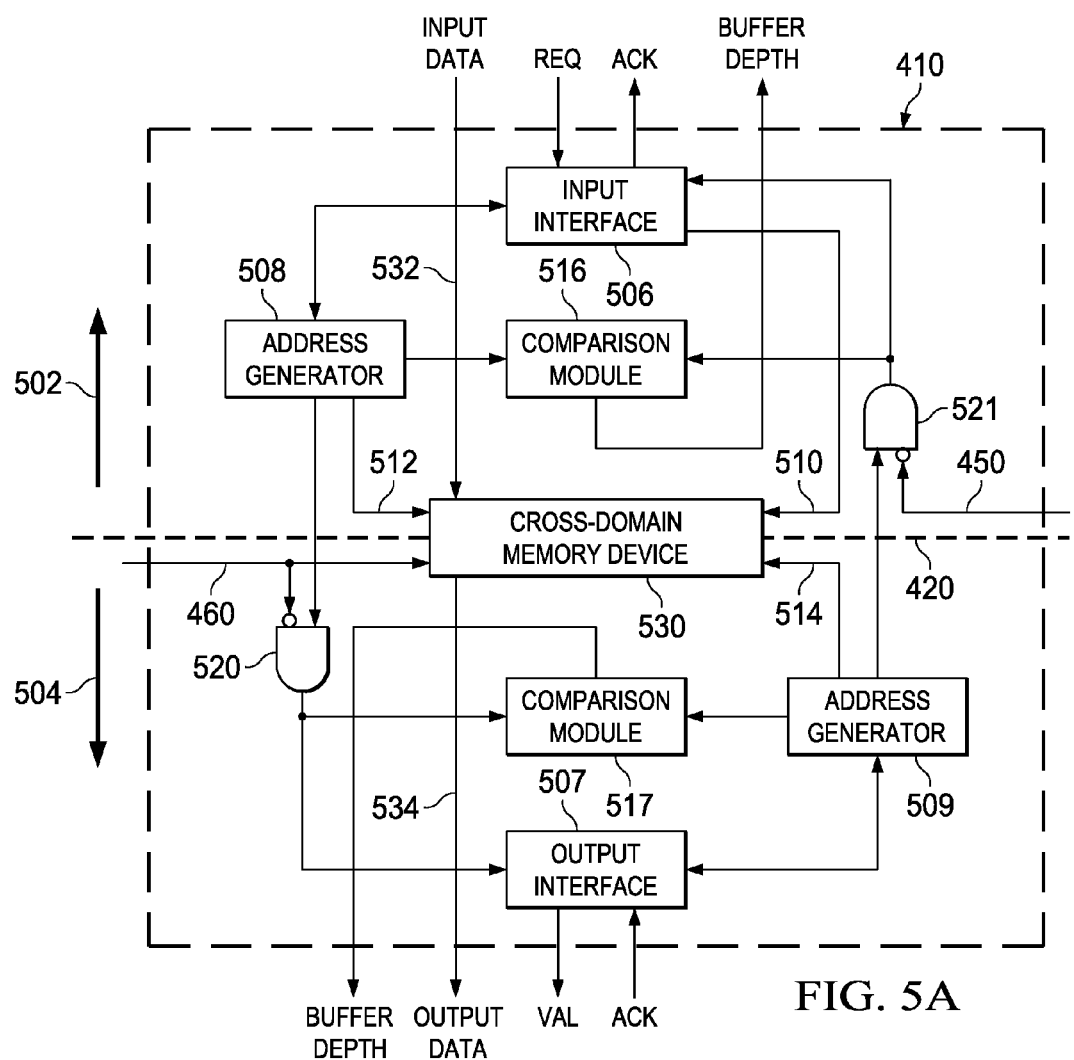
FIG. 5A shows a schematic diagram illustrating an exemplary cross-domain buffer.

FIG. 5A shows a schematic diagram illustrating an exemplary cross-domain buffer 410. More particularly, the diagram of FIG. 5A describes an asynchronous First-In-First-Out (FIFO) buffer, which is presented for explanatory purposes only, and other buffer types and topologies may be used without departing from the scope of the disclosure. In other implementations, synchronous FIFO buffers and/or other types of communication channels may be implemented between power domains and modified to provide the logical and electrical isolation described herein.

As shown in FIG. 5A, the buffer 410 may be disposed over both an input power domain 502 and an output power domain 504. The buffer 410 may comprise a cross-domain memory device 530 which may receive input data 532 from a sending node (not shown) in the input power domain 502, and the memory device 530 may further send output data 534 to a receiving node (not shown) in the output power domain 504, thereby allowing data to cross the power domain boundary 420. In some implementations in accordance with the disclosure, the memory device 530 may comprise a plurality of addressable memory cells in the input power domain 502 and a plurality of addressable memory cells in the output power domain 504, the memory cells in the output power domain 504 being mirrored with the memory cells in the input power domain 502.

The buffer 410 may write to the memory device 530 using a memory write enable signal 510 and a memory write address 512 in the input power domain 502. The buffer 410 may also read from the memory device 530 using a memory read address 514 in the output power domain 504.

The buffer 410 may have an input interface 506 that receives a request ("Req") signal from the sending node in the input power domain 502 and provides an acknowledgement ("Ack") signal from the receiving node back to the sending node. If both signals are asserted, the buffer 410 may determine that the sending node in the input power domain 502 is ready to write data and the receiving node in the output power domain 504 is ready to read data. The input interface 506 may then trigger a write to the memory device 530 through the memory write enable signal 510.

The buffer 410 may further comprise address generators 508 and 509 to generate memory address values and/or encoded numerical values (e.g., Gray-coded counter values) for the power domains 502 and 504, respectively. The address values may be used for reading and writing to the memory cells in the cross-domain memory device 530. For example, the address generator 508 may determine a memory write address 512 to which a portion of the input data 532 may be written, and the address generator 508 may increment the memory write address 512 or a numerical value corresponding to the memory write address 512 after the portion of the input data 532 is written. Similarly, the address generator 509 may determine a memory read address 514 from which a portion of the output data 534 may be read, and the address generator 509 may increment the memory read address 514 or a numerical value corresponding to the memory read address 514 after the portion of the output data 534 is read.

Comparison modules 516 and 517 may calculate the difference between the addresses (or numerical values corresponding to the addresses) on either side of the boundary 420 to determine the instantaneous buffer depth and to provide this depth to logic in their respective power domains. Depth information may be useful in determining when the buffer 410, through its memory device 530, is full or empty. The maximum buffer depth may be associated with the number of bits used by the address generators 508, 509 and the size of the memory device 530. For example, five bits may be used to provide a maximum buffer depth of $2^5$ or 32. In accordance with some aspects of the disclosure, the addresses may be encoded using Gray coding, and the address generators 508, 509 may provide an extra bit to help differentiate between scenarios where the memory device 530 is full and scenarios where the memory device 530 is empty during depth comparison.

The address generator 508 may pass the write address, or a numerical value corresponding to the write address (e.g., a Gray-coded counter value), to the output power domain 504 via an electrical isolation gate 520, where the electrical isolation gate 520 may selectively provide electrical isolation at the boundary. A similar electrical isolation gate 521 may enable the read address, or a numerical value corresponding to the read address (e.g., a Gray-coded counter value), to cross from the output power domain 504 to the input power domain 502. While FIG. 5A shows electrical isolation gates 520, 521 as implemented through AND gates, other logical gates (e.g., OR, NOR, and NAND) may be used. An exemplary transistor-level implementation of an electrical isolation gate is discussed further below, with respect to FIG. 5B.

The electrical isolation gate 520 may receive an "Electrical Isolate Out" signal 460 from a control signal bus to determine whether the output of the address generator 508 may pass through the electrical isolation gate 520. When the signal 460 is asserted (e.g., pulled high), the electrical isolation gate 520 may block the write address or a corresponding numerical value from entering the output power domain 504. When the signal 460 is de-asserted, the write address or the corresponding numerical value may be passed from the input power domain 502 to the output power domain 504 as an output signal that may be level shifted, depending on the relative voltages of the input power domain 502 and the output power domain 504. Techniques for providing level shifting are readily known to one of ordinary skill in the art and will not be further described herein. The signal 460 may also determine whether or not the output data 534 may be read from the cross-domain memory device 530.

Similarly, the electrical isolation gate 521 may selectively allow the read address or the corresponding numerical value generated in the output power domain 504 by the address generator 509 to enter the input power domain 502. The electrical isolation gate 521 may receive an "Electrical Isolate In" signal 450 from the control signal bus to determine whether the electrical isolation gate 521 blocks the read address or corresponding numerical value from reaching the input power domain 502. Both electrical isolation gates 520, 521 may be the nearest gates to the power domain boundary 420 within their respective power domains 504, 502.

The buffer 410 may be capable of managing asynchronous clocks and/or clock jitter between the power domains 502, 504, such that the addresses and/or numerical values are reliably sent across the boundary 420. Accordingly, the address and/or numerical value output from the electrical isolation gate 520 may be received by an output interface 507. If the output interface 507 detects an incrementation in the write address (or the numerical value corresponding to the write address) that is output from the electrical isolation gate 520, the output interface 507 may generate a valid data ("Val") signal indicative of valid data in the memory device 530, which may be sent to the receiving node (not shown) in the output power domain 504. Once the receiving node is able to process the valid data signal, it may generate an acknowledgement ("Ack") signal to be received by the output interface 507 and conveyed to the sending node (not shown) through the input interface 506.

Figure 5B:
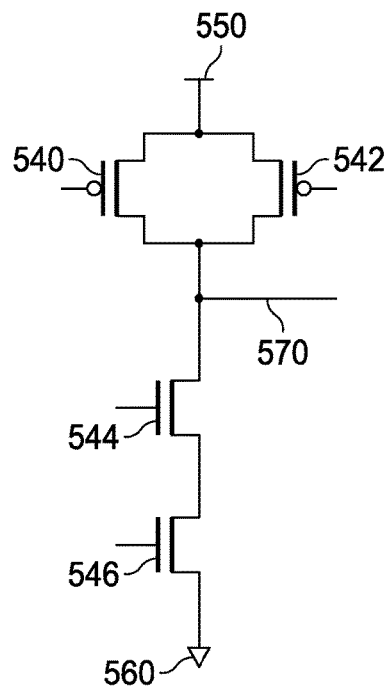
FIG. 5B shows a schematic diagram illustrating an exemplary electrical isolation gate.

FIG. 5B shows a schematic diagram illustrating an exemplary electrical isolation gate. More specifically, FIG. 5B shows a transistor-level implementation of a NAND gate using complementary metal-oxide-semiconductor (CMOS) technology, which may be used to form the electrical isolation gates 520 and/or 521 in FIG. 5A.

The electrical isolation gate of FIG. 5B may comprise two p-channel MOS (PMOS) transistors 540 and 542 and two n-channel MOS (NMOS) transistors 544 and 546. The PMOS transistors 540 and 542 may be connected in parallel between a net 570 and a supply voltage rail 550. The NMOS transistors 544 and 546 may be connected in series between the net 570 and a ground rail 560. As is known in the art, when either PMOS transistor 540 or 542 receives a low voltage at their gates, then the net 570 may be pulled to a high voltage. If both NMOS transistors 544 and 546 receive a high voltage at their gates, then the net 570 may be pulled to a low voltage. One range of voltages may be associated with a high logic value, and another range of voltages may be associated with a low logic value, where the ranges are chosen based, in part, upon the threshold voltages of the transistors 540, 542, 544, 546. For the purposes of the following discussion, a low logic value may be associated with voltages that enable PMOS transistors 540, 542 (e.g., such that their sources and drains are connected) and disable NMOS transistors 544, 546 (e.g., such that their sources and drains are not connected), whereas a high logic value may be associated with voltages that disable the PMOS transistors 540, 542 and enable the NMOS transistors 544, 546.

The PMOS transistor 540 and the NMOS transistor 544 may both receive an input signal at their gates. Similarly, the PMOS transistor 542 and the NMOS transistor 546 may both receive a "pass" signal at their gates, where the pass signal may be the logical inverse of an electrical isolation signal. An output signal may be provided on the net 570.

Through this implementation, the pass signal may determine whether or not the input signal is passed and inverted to become the output signal on the net 570. As shown in FIG. 5A, the pass signal and the output signal may be received from or delivered to one power domain, whereas the input signal may be received from another power domain.

The electrical isolation gate of FIG. 5B may selectively and effectively block activity on one power domain from affecting activity in another power domain, thereby providing electrical isolation between the power domains. For example, when the pass signal is at a low logic value, the PMOS transistor 542 pulls the net 570 to a high voltage, forcing the output signal to have a high logic value. In such a condition, the output signal is independent of the input signal. This allows the input signal to vary its logic level and even reach the normally problematic intermediate voltages between logic levels without affecting the output signal on the net 570.

The electrical isolation gate of FIG. 5B allows for one bit of information to pass a power domain boundary. Accordingly, it may be replicated as needed to pass addresses, numerical values, and/or other information across power domains.

Figure 6:
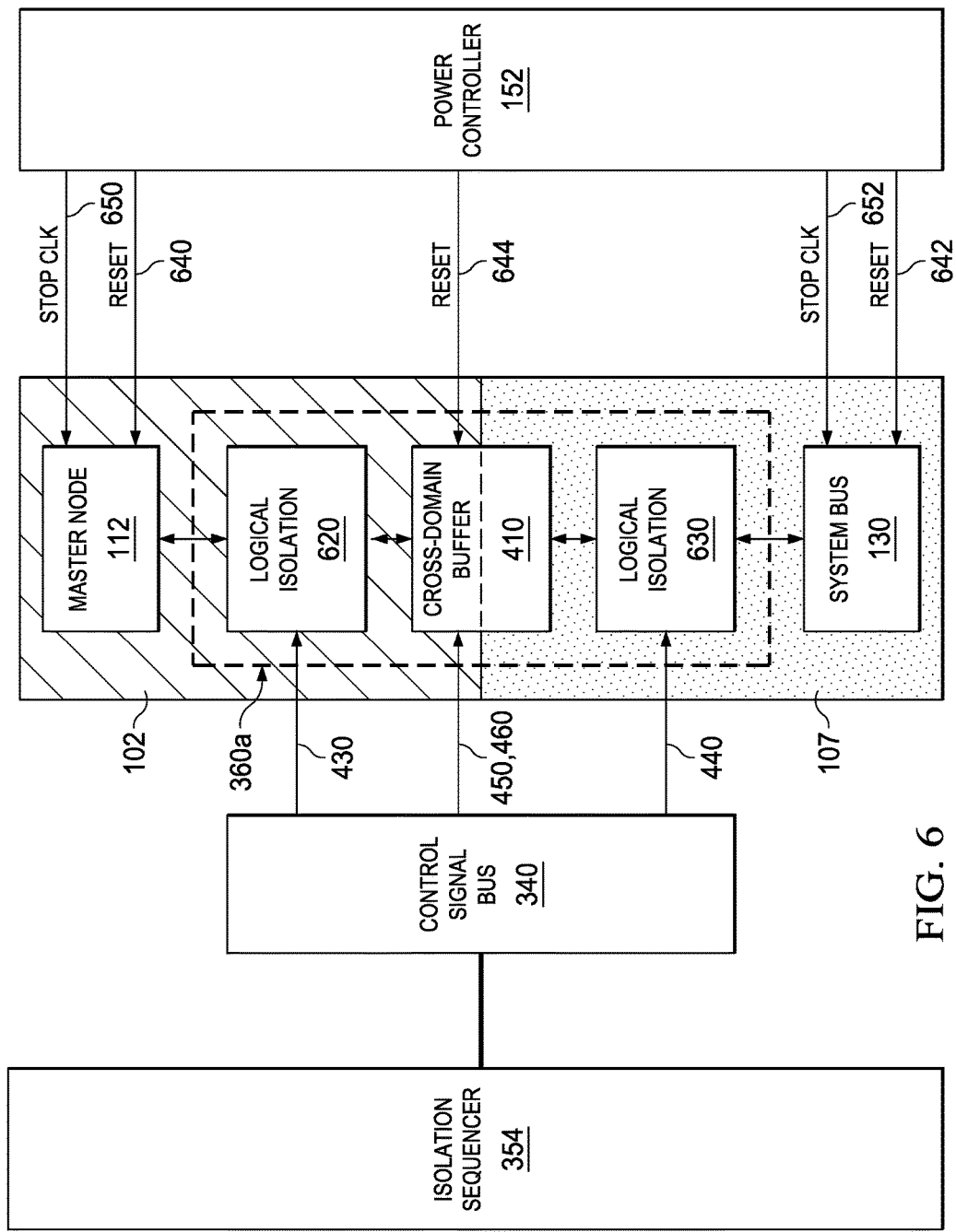
FIG. 6 shows a block diagram of a system for providing isolation between power domains.

FIG. 6 shows a block diagram of a system for providing isolation between power domains. As was also shown in FIG. 3, a master node 112 may reside in a first power domain 102 (e.g., a master power domain 102), and a system bus 130 in a second power domain 107 (e.g., a slave, bus, or other power domain 107). The system bus 130 may be an interface (e.g., AXI interface) connecting the master node 112 to other nodes. However, the disclosed principles also apply to scenarios where two nodes are in communication with one another without using the system bus 130 (e.g., through the isolation module 360h of FIG. 3).

A buffer 410 may be disposed at the boundary between the first power domain 102 and the second power domain 107. The buffer 410 may, for example, be an asynchronous FIFO buffer as described above with respect to FIG. 5A. The buffer 410 may be selectively isolated from the master node 112 by logical isolation 620, and the buffer 410 may also be selectively isolated from the system bus 130 by logical isolation 630. The logical isolation 620 and 630 may be implemented as logical isolation gates as shown in FIG. 4 or other suitable circuitry for logically isolating the buffer 410 from the master node 112 and the system bus 130. The isolation sequencer 354 may provide logical isolation signals 430 and 440 through the control signal bus 340 to the logical isolation 620 and 630, respectively. The isolation sequencer 354 may also provide electrical isolation signals 450 and 460 through the control signal bus 340 to control the electrical isolation within the buffer 410. The buffer 410, together with the logical isolation 620 and 630, may form an isolation module 360a.

In accordance with the disclosed techniques, a power controller 152 may provide three reset signals 640, 642, and 644 relating to the first power domain 102, the second power domain 107, and the isolation module 360a, respectively. The reset signals 640 and 642 may be provided after the respective power domains are powered on from a power collapsed state. In some contemplated implementations, the reset signal 644 may be a logical OR of the reset signals 640 and 642, such that the reset signal 644 is triggered any time that either reset signal 640 or the reset signal 642 is triggered. As a result, the isolation module 360a may be reset whenever either the master node 112 or the system bus 130 is reset.

In accordance with some aspects of the disclosure, the isolation module 360a may be reset independently from the master node 112 and the system bus 130, and vice versa. In other words, the power domains 102, 107 and their constituent logic or processing nodes need not be reset when the buffer 410 is reset, thereby reducing the processing overhead associated with power collapse. For example, after an isolation sequence, the system bus 130 may be power collapsed. However, the master node 112 may retain an active channel configuration for communication with the system bus 130 even when the system bus's power domain 107 is collapsed. At a later time, the power domain 107 may be powered on and isolation may be removed, with the system bus 130 and the buffer 410 being reset in the process. The master node 112, having not undergone a reset during the power collapse of the system bus 130, may use the active channel configuration to readily resume communication with the system bus 130 over the buffer 410.

The power controller 152 may send stop clock signals 650 and 652 to the master node 112 and the system bus 130, respectively. The signals 650 and 652 may be asserted when the power domains are being isolated or de-isolated from one another. For example, during an isolation sequence, the stop clock signals 650 and 652 may both be asserted before the domains are logically and electrically isolated from one another. After the logical isolation and electrical isolation are applied, the stop clock signals 650 and 652 may individually be de-asserted, depending on whether each power domain intends to continue operation after the isolation process. The stop clock signals 650 and 652 may also be used during a de-isolation process, as will be described in further detail with respect to FIG. 8.

The topology shown in FIG. 6 provides the benefit of logically separating the domain transition logic (e.g., the buffer 410) from circuitry in the adjacent power domains (e.g., the master node 112 and the system bus 130). The increased level of modularity simplifies independent power collapse of the power domains 102 and 107.

Figure 7:
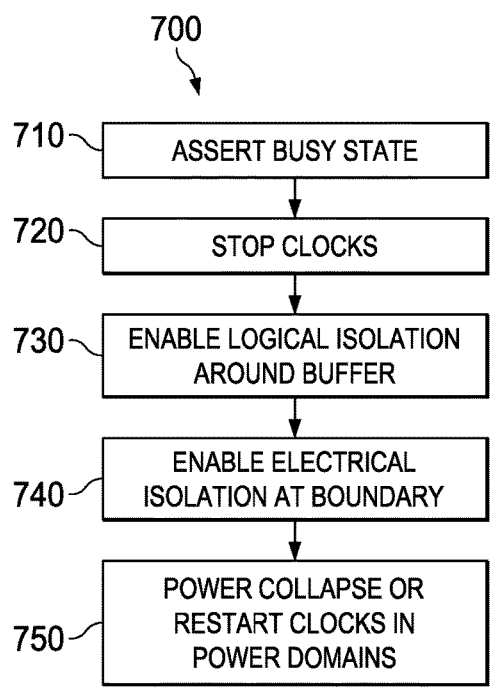
FIG. 7 shows a flowchart illustrating a sequence for providing isolation at a selected boundary between two power domains.

FIG. 7 shows a flowchart illustrating a sequence 700 for providing isolation at a selected boundary between two power domains.

At action 710, an isolation sequencer may assert a busy state indicating that the isolation sequencer is in the process of performing an isolation sequence. In accordance with some aspects of the disclosure, the isolation sequencer may service one or more modules (e.g., the power controller 152 of FIG. 3), where each module may place isolation requests to the isolation sequencer. If the isolation sequencer is limited to performing one isolation sequence at a time, the busy signal may be used to indicate the isolation sequencer's availability to the requesting module(s) placing isolation requests. The isolation sequencer may store a queue of isolation requests, or the requesting module(s) may wait to repeat the isolation requests at another time if the isolation sequencer is busy.

In accordance with some aspects of the disclosure, the isolation sequencer may be capable of implementing a plurality of isolation sequences in parallel. Accordingly, the isolation sequencer may assert the busy signal when it is at maximum capacity. If the isolation sequencer is capable of servicing all potential requests of the module(s) simultaneously, a busy signal may not be used.

At action 720, the isolation sequencer may stop the clocks on both sides of the selected boundary. These clocks may, for example, be a core clock of a master node and a bus clock of an interface. Alternatively, if a master node is connected directly to a slave node or a second master node, the two clocks may be the core clock of the master node and a secondary clock of the slave node or of the second master node. In some implementations, a few processing cycles may be permitted for the nodes within the affected power domains to store any intermediate work before the clocks are stopped.

In accordance with some aspects of the disclosure, the isolation sequencer may issue a halt signal to the power domains to indicate that their clocks will be stopped. The isolation sequencer may wait for acknowledgement from the power domains that the power domains (and the nodes therein) are ready to have their clocks stopped before performing the action 720. The isolation sequencer may also wait for an acknowledgement that buffers within isolation modules associated with the boundary between the two power domains are empty, as the data within these buffer may be lost once the isolation modules are activated.

At action 730, the isolation sequencer may enable logical isolation around a buffer located at the boundary. This action may be performed in accordance with the accompanying description of FIGS. 4 and 6 above. When the action 730 is completed, each power domain may be logically isolated from the buffer.

At action 740, the isolation sequencer may enable electrical isolation at the boundary, which may, for example, occur within the buffer. This action may be performed in accordance with the accompanying descriptions of FIGS. 4 and 5 above. Further, the isolation sequencer may store information indicating that the selected boundary has been isolated.

When the action 740 is completed, the two power domains on either side of the boundary may be isolated from one another. Accordingly, either or both of the power domains may be power collapsed at action 750 without affecting the other power domain. If a selected power domain shares a boundary (e.g., exchanges data and/or control signals) with more than one other power domain, the isolation sequencer may need to perform the sequence 700 at other power domains before allowing the selected power domain to collapse (e.g., by notifying a power controller that the selected power domain is isolated, as described in FIG. 3). If a plurality of buffers are implemented at a boundary, the process 700 may be performed in parallel on each of the plurality of buffers at the boundary.

Also at the action 750, if a power domain is intended to remain powered on after being isolated, its clock may be restarted. In accordance with the disclosed techniques, the power domains themselves need not necessarily be restarted (e.g., through a full boot-up sequence and reestablishment of communication channels shared with other power domains). A few processing cycles may be required to recover any intermediate work and resume operation, but significant time may be saved when compared to a full reset of the power domain.

The nodes within the recently isolated power domains may continue with the operations being performed prior to the clocks being stopped. In some scenarios, a node in an active (powered on) power domain may not even be aware that it has been isolated from a node in another power domain across the selected boundary. As a result, the node may maintain seemingly active communication channels. If the node later tries to send a message on one such channel before the node intended to receive the message is powered on, the system may provide an alert and/or begin a power sequence and a de-isolation sequence to reestablish the communication channel.

In some scenarios, neither of the power domains associated with the selected boundary are power collapsed after the selected boundary is isolated. As such, the decision to apply isolation at a boundary may be made independently from a power collapse decision. One of the power domains may be power collapsed at a later time, if each of the other boundaries is isolated.

Figure 8:
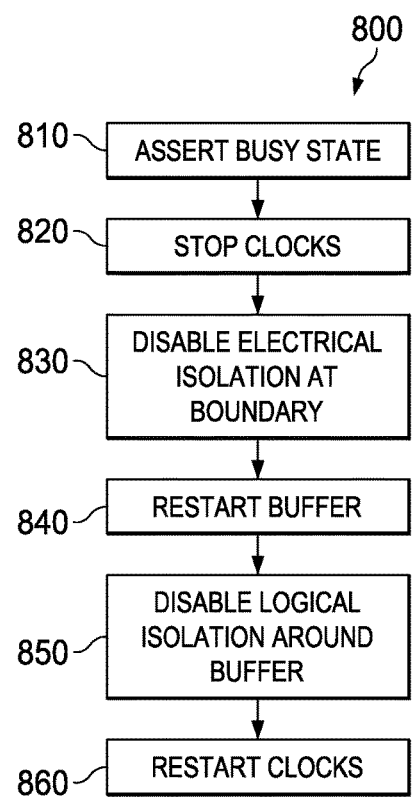
FIG. 8 shows a flowchart illustrating a sequence for removing isolation at a selected boundary between two power domains.

FIG. 8 shows a flowchart illustrating a sequence 800 for removing isolation at a selected boundary between two power domains. The sequence 800 may generally be applied during a time when both power domains are powered on and nodes within these power domains are ready to resume communications between each other.

At action 810, an isolation sequencer may assert a busy state indicating that the isolation sequencer is in the process of performing an isolation sequence. As described above with respect to the isolation sequence, the busy state may not be required, depending on the capabilities of the isolation sequencer.

At action 820, the isolation sequencer may stop the clocks, if active, of the power domains on either side of the selected boundary.

At action 830, the isolation sequencer may disable the electrical isolation within the buffer located at the selected boundary. This action may be performed in accordance with the accompanying descriptions of FIGS. 4 and 5 above.

At action 840, the isolation sequencer may issue a restart signal to the buffer. This action may set the buffer depth value to zero and set the read pointer to be equal to the write pointer (e.g., via manipulation of the values stored and generated by the address generators of FIG. 5A).

At action 850, the isolation sequencer may disable the logical isolation around the buffer, thereby connecting the buffer to nodes and/or interfaces in the power domains on either side of the selected boundary. This action may be performed in accordance with the accompanying description of FIGS. 4 and 6 above. In accordance with some aspects of the disclosure, the isolation sequencer may update stored information to indicate that the selected boundary is no longer isolated.

At action 860, the clocks of the power domains on either side of the selected boundary may be restarted. However, these power domains do not necessarily need to be further reset, thereby saving processing cycles with respect to prior implementations. From the perspective of each power domain, it may seem as though the other domain was never disconnected, but instead was simply left idle. This can greatly reduce the effort associated with re-configuring each data connection.

The isolation and de-isolation sequences of FIGS. 7-8 may be initiated by signals sent from a power controller in the always-on power domain, the isolation sequencer itself, or even from processing nodes or logic within the collapsible power domains.

Figure 9:
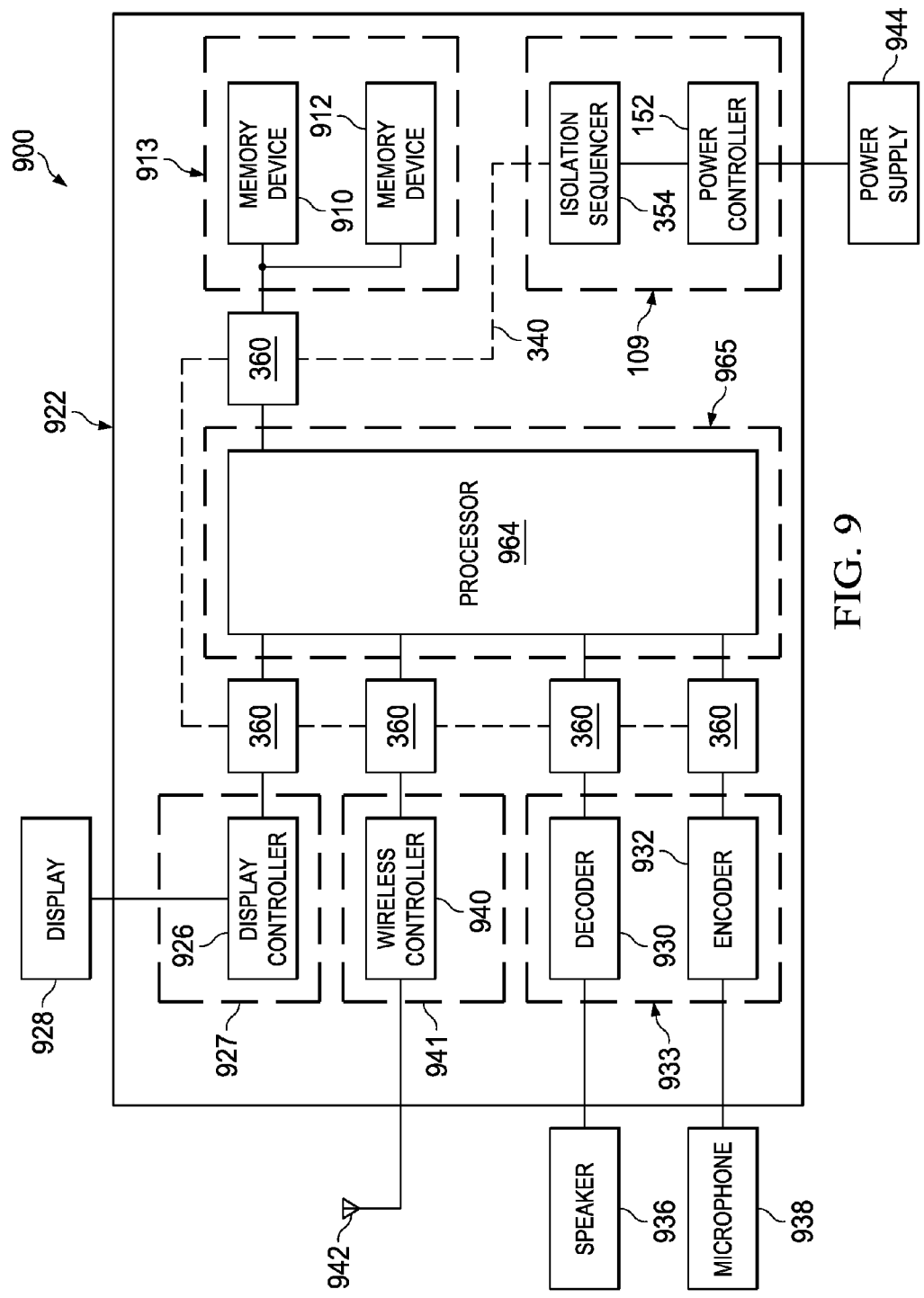
FIG. 9 shows a block diagram of an exemplary wireless device having a plurality of power domains that may be selectively isolated from one another in accordance with the disclosed principles.

FIG. 9 shows a block diagram of an exemplary wireless device 900 having a plurality of power domains that may be selectively isolated from one another in accordance with the disclosed principles. The wireless device 900 may comprise a system-on-chip device 922 (or system-in-package device 922) having a processor 964, a display controller 926, a wireless controller 940, a decoder 930, an encoder 932, a first memory device 910, a second memory device 912, an isolation sequencer 354, and a power controller 152. As shown in FIG. 9, the system-on-chip device 922 may couple with a display 928, a speaker 936, a microphone 938, a wireless antenna 942, and a power supply 944 that may each be external to the system-on-chip device 922.

The system-on-chip device 922 may be partitioned into multiple power domains 109, 913, 927, 933, 941, and 965. Each power domain may include logic or processing nodes that are selectively coupled to the power supply 944 via one or more power connections (not shown). Each power domain may be designated as always-on or collapsible. An always-on power domain (e.g., the power domain 109) may be powered on at all times that the wireless device 900 is powered on. A collapsible power domain (e.g., the power domains 913, 927, 933, 941, and 965) may be powered off during times when the logic or processing nodes in the power domain are not utilized. Each collapsible power domain may be powered on or off independently of the other collapsible power domains. As used herein, "power off," and "power collapse" are synonymous terms that are used interchangeably.

Power consumption due to leakage current can be reduced by powering off as many collapsible power domains within the system-on-chip device 922 as possible when these power domains are not in use. Many processing nodes may only be active for a small percentage of the time while the wireless device 900 is idle. In this case, many of the collapsible power domains can be powered off (e.g., "collapsed") for a large portion of the time to reduce power consumption and extend standby time.

The processor 964 may be disposed in the power domain 965 of the system-on-chip device 922 and may comprise a microcontroller, a digital signal processor (DSP), or another type of processor. The processor 964 may be coupled with the memory devices 910, 912, which may both be provided in the power domain 913. The memory devices 910, 912 may share an interface by which they communicate with the processor 964 (as shown in FIG. 9) or they may have separate interfaces to the processor 964. An isolation module 360 may be placed at each of the one or more interfaces between the memory devices 910, 912 and the processor 964 to selectively provide isolation between the power domain 965 and the power domain 913.

The memory devices 910, 912 may comprise volatile or nonvolatile memory. For example, volatile memory may store data and code used by the processor 964 and may be implemented with, for example, synchronous dynamic RAM (SDRAM) or other types of memory. Non-volatile memory may provide bulk storage and may be implemented with, for example, NAND Flash, NOR Flash, or other types of memory.

The processor 964 may be coupled to the display controller 926 through an isolation module 360, where the display controller 926 may format and/or provide video data for the display 928. The display controller 926 may be disposed in the power domain 927, which may be power collapsed when the system-on-chip device 922 is not providing video data to the display 928. The video data may, for example, be transferred from the memory device 910 to the display controller 926 through the processor 964.

The processor 964 may further be coupled with the wireless controller 940, which may include a modem and may reside in the power domain 941. The wireless controller 940 may control the wireless antenna 942 to send and receive wireless data, which may passed to the processor 964 through an isolation module 360.

The processor 964 may further be coupled with the decoder 930 and the encoder 932, which may provide and receive audio data (e.g., voice data) to and from the speaker 936 and the microphone 938, respectively. The decoder 930 and the encoder 932 may be disposed in the power domain 933 that may be power collapsed when the speaker and microphone are disabled. The decoder 930 and the encoder 932 may be integrated into a unified coder-decoder (CODEC) or may otherwise share a power domain 933. Isolation modules 360 may be deployed between the power domain 933 of these peripherals and the power domain 965 of the processor 964. As shown in FIG. 9, the decoder 930 may have a separate interface to the processor 964 than does the encoder 932, and so a plurality of isolation modules 360 may be used.

As described above, the power controller 152 may generate various control signals to support power collapsing and powering on the collapsible power domains. The power controller 152 may maintain a finite state machine (FSM) for each processing node within the system-on-chip device 922 (e.g., the display controller 926) and/or for each collapsible power domain. Using various inputs (e.g., hardware or software interrupts) and state information indicated by the finite state machines, the power controller 152 may generate control signals to power collapse and power on the collapsible power domains at appropriate times to optimize energy consumption. As described above, the power controller's control signals may also include signals to stop the clocks of the power domains and to reset the power domains and the buffers within the isolation modules 360.

The isolation sequencer 354 may perform any of the functions described above (e.g., with respect to FIGS. 4-8). For example, the isolation sequencer 354 may generate and send control signals on the control signal bus 340 to isolate various power domains from one another through the isolation modules 360. The isolation sequencer 354 may make decisions that are not necessarily dependent on the decisions and actions of the power controller 152. For example, the isolation sequencer 354 may isolate a power domain from another power domain on the basis of whether communication is expected between the power domains instead of simply because one or both of the power domains are scheduled to be power collapsed by the power controller 152. In other words, the isolation decisions may be decoupled, at least partially, from the power collapse decisions. The standardization and decoupling of isolation control sequences from power collapse control sequences can provide the benefits of increased design simplicity and reuse as well as increased flexibility in power control.

In general, the system-on-chip device 922 may include fewer, more, and/or different processing nodes than those shown in FIG. 9. The specific processing nodes included in the system-on-chip device 922 are typically dependent on the requirements of the device 922, such as the communication systems and external units intended to be supported. The system-on-chip device 922 may also couple to fewer, more, and/or different external units than those shown in the exemplary wireless device 900 of FIG. 9.

The processor 964 may be implemented in a single CMOS integrated circuit for various benefits such as smaller size, lower cost, less power consumption, and so on. Further, any or all of the external units shown in FIG. 9 may be included in a common integrated circuit with the processor 964.

The depiction of the wireless device 900 in FIG. 9 does not take the size or layout of the various units into account. In many implementation, the always-on power domain 109 may occupy only a small portion (e.g., two to three percent) of the total die area of an integrated circuit and may be the basis for a similarly small portion of power consumption when the wireless device 900 is in an active state. Thus, leakage current for the wireless device 900 may be significantly reduced by powering off the collapsible power domains when the processing nodes within these domains are not needed.

Although FIG. 9 depicts a wireless device 900, the isolation modules 360 and other elements within the system-on-chip device 922 may also be integrated into numerous other devices such as set-top boxes, music players, video players, entertainment units, navigation devices, personal digital assistants (PDA), fixed location data units, cellular phones, and computers. In general, the disclosed techniques are applicable to a wide range of systems. For example, wired computing systems, transportation systems, medical devices, imaging and video-related systems, and systems for managing sensors are only some of the other systems that benefit from the disclosed techniques for efficiently applying signal isolation and buffers between collapsible power domains.

While various embodiments in accordance with the disclosed principles have been described above, it should be understood that they have been presented by way of example only, and are not limiting. Thus, the breadth and scope of the disclosure should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

It is contemplated that buffers, logic gates, nodes, buses, and other elements be provided according to the processes and structures disclosed herein in integrated circuits of any type to which their use commends them, such as ROMs, RAM (random access memory) such as DRAM (dynamic RAM), and video RAM (VRAM), PROMs (programmable ROM), EPROM (erasable PROM), EEPROM (electrically erasable PROM), EAROM (electrically alterable ROM), caches, and other memories, and to microprocessors and microcomputers in all circuits including ALUs (arithmetic logic units), control decoders, stacks, registers, input/output (I/O) circuits, counters, to general purpose microcomputers, RISC (reduced instruction set computing), CISC (complex instruction set computing) and VLIW (very long instruction word) processors, and to analog integrated circuits such as digital to analog converters (DACs) and analog to digital converters (ADCs). ASICS, PLAs, PALs, gate arrays and specialized processors such as digital signal processors (DSP), graphics system processors (GSP), synchronous vector processors (SVP), image system processors (ISP), as well as testability and emulation circuitry for them, all represent sites of application of the principles and structures disclosed herein. Still other larger scale applications include photocopiers, printers, modems and other telecommunications equipment, calculators, radio and television circuitry, microwave oven controls, automotive microcontrollers, and industrial controls.

Implementation is contemplated in discrete components or fully integrated circuits in silicon, gallium arsenide, or other electronic materials families, as well as in other technology-based forms and embodiments. It should be understood that various embodiments of the invention can employ or be embodied in hardware, software, microcoded firmware, or any combination thereof. When an embodiment is embodied, at least in part, in software, the software may be stored in a non-transitory machine-readable medium.

Various terms used in the present disclosure have special meanings within the present technical field. Whether a particular term should be construed as such a "term of art" depends on the context in which that term is used. "Connected to," "in communication with," "associated with," or other similar terms should generally be construed broadly to include situations both where communications and connections are direct between referenced elements or through one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context.

Words of comparison, measurement, and timing such as "at the time," "immediately," "equivalent," "during," "complete," "identical," and the like should be understood to mean "substantially at the time," "substantially immediately," "substantially equivalent," "substantially during," "substantially complete," "substantially identical," etc., where "substantially" means that such comparisons, measurements, and timings are practicable to accomplish the implicitly or expressly stated desired result.

Additionally, the section headings herein are provided for consistency with the suggestions under 37 C.F.R. 1.77 or otherwise to provide organizational cues. These headings shall not limit or characterize the subject matter set forth in any claims that may issue from this disclosure. Specifically and by way of example, although the headings refer to a "Field of the Disclosure," such claims should not be limited by the language chosen under this heading to describe the so-called technical field. Further, a description of a technology in the "Background" is not to be construed as an admission that technology is prior art to any subject matter in this disclosure. Neither is the "Summary" to be considered as a characterization of the subject matter set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor device having a first processing node in a first power domain and a second processing node in a second power domain, the semiconductor device comprising:
   an isolation module comprising:
      a buffer located between the first and second power domains, the buffer operable to selectively provide an electrical connection between the first and second power domains;
      a first logical isolation unit between the buffer and the first processing node; and
      a second logical isolation unit between the buffer and the second processing node; and
   an isolation sequencer operable to control the isolation module when an isolation sequence and a de-isolation sequence are performed, wherein, after the isolation sequence is performed, the first and second logical isolation units are operable to logically isolate the buffer from the first and second processing nodes, respectively, and the buffer is operable to provide electrical isolation between the first and second power domains; and wherein, after the de-isolation sequence is performed, the first and second logical isolation units are operable to logically connect the buffer to the first and second processing nodes, respectively, and the buffer is operable to provide electrical de-isolation between the first and second power domains and is operable to provide communication from the first processing node to the second processing node.

2. The semiconductor device of claim 1, further comprising a power controller in communication with the isolation sequencer, wherein the power controller is operable to power collapse and power on the first and second power domains.

3. The semiconductor device of claim 2, wherein the isolation sequencer is operable to provide a busy signal to the power controller when the isolation sequence or the de-isolation sequence is being performed.

4. The semiconductor device of claim 2, wherein the power controller is operable to issue an isolation request to the isolation sequencer.

5. The semiconductor device of claim 4, wherein the isolation sequencer is operable to activate the isolation module such that the isolation sequence is performed without receiving the isolation request from the power controller.

6. The semiconductor device of claim 1, wherein the isolation sequencer waits for the buffer to be empty before allowing the isolation sequence to be completed.

7. The semiconductor device of claim 2, wherein the power controller is further operable to stop clocks associated with the first and second power domains before the isolation sequence is performed.

8. The semiconductor device of claim 1, wherein the buffer, the first power domain, and the second power domain are each operable to receive a distinct reset signal.

9. The semiconductor device of claim 8, wherein the reset signal operable to be received by the buffer is asserted when either the reset signal operable to be received by the first power domain is asserted or the reset signal operable to be received by the second power domain is asserted.

10. The semiconductor device of claim 1, wherein the isolation sequencer is in an always-on power domain that remains powered on whenever the semiconductor device receives power.

11. The semiconductor device of claim 10, wherein the isolation sequencer stores information about whether or not the first power domain is isolated from the second power domain in a memory device in the always-on power domain.

12. The semiconductor device of claim 1, wherein the isolation module further comprises:
a sensor associated with the first logical isolation unit, the sensor operable to generate an alert if the first processing node attempts to communicate with the second processing node during a time when the first power domain is isolated from the second power domain.

13. The semiconductor device of claim 1, wherein the buffer is an asynchronous First-In-First-Out (FIFO) buffer.

14. The semiconductor device of claim 1, wherein the second processing node is an interface or a system bus.

15. The semiconductor device of claim 14, wherein the first processing node is operable to continue operating during a time when it is not connected to the interface or the system bus.

16. A semiconductor device having a first processing node in a first power domain and a second processing node in a second power domain, the semiconductor device comprising:
an isolation module operable to selectively enable communication from the first processing node to the second processing node, the isolation module comprising:
means for selectively providing an electrical connection between the first and second power domains; and
means for logically isolating the means for selectively providing the electrical connection from both the first processing node and the second processing node; and
means for controlling the isolation module when an isolation sequence and a de-isolation sequence are performed,
wherein, after the isolation sequence is performed, the means for selectively providing the electrical connection is logically isolated from the first and second processing nodes, and electrical isolation is provided between the first and second power domains; and
wherein, after the de-isolation sequence is performed, the means for selectively providing the electrical connection logically connects the first and second processing nodes, and electrical de-isolation is provided between the first and second power domains, and the isolation module permits communication from the first processing node to the second processing node.

17. The semiconductor device of claim 16, further comprising means for power collapsing and powering on the first and second power domains.

18. The semiconductor device of claim 17, further comprising means for providing a busy signal to the means for power collapsing and powering on the first and second power domains to indicate when the isolation sequence or the de-isolation sequence is being performed.

19. The semiconductor device of claim 16, further comprising means for generating an alert if the first processing node attempts to communicate with the second processing node during a time when the first power domain is isolated from the second power domain.

20. The semiconductor device of claim 16, wherein the means for selectively providing the electrical connection comprises an asynchronous First-In-First-Out (FIFO) buffer.

21. The semiconductor device of claim 16, wherein the second processing node is an interface or a system bus.

22. The semiconductor device of claim 21, wherein the first processing node is operable to continue operating during a time when it is not connected to the interface or a system bus.

23. A non-transitory machine-readable medium having instructions stored thereon, the instructions executable by one or more processors for:
selectively logically connecting, by a first logical isolation unit, a buffer to a first processing node in a first power domain;
selectively logically connecting, by a second logical isolation unit, the buffer to a second processing node in a second power domain;
enabling, within the buffer, electrical de-isolation between the first and second power domains;

disabling clocks associated with the first and second power domains;

logically isolating, by the first logical isolation unit, the buffer from a first processing node in the first power domain;

logically isolating, by the second logical isolation unit, the buffer from a second processing node in the second power domain;

enabling, within the buffer, electrical isolation between the first and second power domains; and re-enabling the clocks associated with at least one of the first and second power domains;

wherein, after the de-isolation sequence is performed, the first and second logical isolation units are operable to logically connect the buffer to the first and second processing nodes, respectively, and the buffer is operable to provide the electrical de-isolation between the first and second power domains and is operable to provide communication from the first processing node to the second processing node.

24. The non-transitory machine-readable medium of claim 23, wherein the instructions are further executable by the one or more processors for:

storing, by a memory device in an always-on power domain, information indicating whether or not the first power domain is isolated from the second power domain.

25. The non-transitory machine-readable medium of claim 23, wherein the instructions are further executable by the one or more processors for:

generating an alert if the first processing node attempts to communicate with the second processing node during a time when the first processing node is isolated from the second processing node.

26. The non-transitory machine-readable medium of claim 23, wherein the instructions are further executable by the one or more processors for:

resetting the buffer using a reset signal that is distinct from reset signals provided to the first and second processing nodes.

27. A method for providing isolation between a first processing node in a first power domain and a second processing node in a second power domain, the method comprising:

selectively logically connecting, by a first logical isolation unit, a buffer to a first processing node in a first power domain;

selectively logically connecting, by a second logical isolation unit, the buffer to a second processing node in a second power domain;

enabling, within the buffer, electrical de-isolation between the first and second power domains;

disabling clocks associated with the first and second power domains;

logically isolating, by the first logical isolation unit, the buffer from the first processing node;

logically isolating, by the second logical isolation unit, the buffer from the second processing node;

enabling, within the buffer, electrical isolation between the first and second power domains; and re-enabling the clocks associated with at least one of the first and second power domains.

28. The method of claim 27, further comprising:

storing, by a memory device in an always-on power domain, information indicating whether or not the first power domain is isolated from the second power domain.

29. The method of claim 27, further comprising:

generating an alert if the first processing node attempts to communicate with the second processing node during a time when the first processing node is isolated from the second processing node.

30. The method of claim 27, further comprising:

resetting the buffer using a reset signal that is distinct from reset signals provided to the first and second processing nodes.

* * * * *